(12) United States Patent  
Yu et al.

(10) Patent No.: US 9,633,882 B2
(45) Date of Patent: Apr. 25, 2017

(54) INTEGRATED CIRCUITS WITH ALIGNMENT MARKS AND METHODS OF PRODUCING THE SAME

(71) Applicant: GLOBALFOUNDRIES Singapore Pte. Ltd., Singapore (SG)

(72) Inventors: Ying Yu, Singapore (SG); Jianbo Sun, Singapore (SG); Derui Yin, Singapore (SG); Yelehanka Ramachandramurthy Pradeep, Singapore (SG); Rakesh Kumar, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 3 days.

(21) Appl. No.: 14/868,645

(22) Filed: Sep. 29, 2015

(65) Prior Publication Data

US 2017/0092523 A1 Mar. 30, 2017

(51) Int. Cl.
*H01L 21/68* (2006.01)
*H01L 23/544* (2006.01)

(52) U.S. Cl.
CPC .......... *H01L 21/681* (2013.01); *H01L 23/544* (2013.01); *H01L 2223/54426* (2013.01)

(58) Field of Classification Search
CPC .............. H01L 21/681; H01L 23/544; H01L 2223/54426
USPC ........................................................ 257/618
See application file for complete search history.

(56) References Cited

U.S. PATENT DOCUMENTS

2012/0313236 A1* 12/2012 Wakiyama ............ H01L 23/544
257/734

* cited by examiner

*Primary Examiner* — Fernando L Toledo
*Assistant Examiner* — Adam S Bowen
(74) *Attorney, Agent, or Firm* — Lorenz & Kopf, LLP

(57) ABSTRACT

Methods of producing integrated circuits with interposers and integrated circuits produced from such methods are provided. In an exemplary embodiment, a method of producing an integrated circuit includes forming a base layer overlying a substrate, and forming an alignment mark overlying the base layer. A first layer is formed overlying the base layer and the alignment mark, and the first layer has a first layer thickness. A second layer is formed overlying the first layer, where the second layer has a second layer thickness and where a combined thickness of the first and second layer thicknesses is from about 2 to about 50 micrometers. A second component is formed from the second layer.

19 Claims, 6 Drawing Sheets

INTEGRATED CIRCUITS WITH ALIGNMENT MARKS AND METHODS OF PRODUCING THE SAME

TECHNICAL FIELD

The technical field generally relates to integrated circuits with alignment marks and methods of producing the same, and more particularly relates to integrated circuits with waveguides and alignment marks and methods of producing the same.

BACKGROUND

The semiconductor industry is continuously moving toward the fabrication of smaller and more complex integrated circuits with higher performance. One type of integrated circuit is an optical circuit that uses light or other electromagnetic radiation for circuit operations. Some common components of optical integrated circuits include light sources, detectors, and waveguides, where waveguides can provide many functions including transmitting, splitting, coupling, combining, multiplexing, demultiplexing, and switching optical signals. Planar lightwave circuits (PLC) are optical circuits that are produced on a plan, and are typically produced on a wafer. PLC technology can be used for many types of optical devices, including monolithic (optical functions only) and hybrid opto-electrical integrated circuits. Comparable optical fiber devices having similar functions to PLC devices would typically be much larger in size.

A planar waveguide transmits light, and some planar waveguides include a dual core structure. A first core is primarily used for transmitting light, and an adjacent second core reflects light into the first core. The dual core structure can increase the intensity of the light transmitted, because the second core can accept and direct more light into the first core than a similar sized first core without an adjacent second core. The second core typically has a refractive index that is slightly lower than the refractive index of the first core so the light is directed from the second core into the first core. The lower refractive index of the second core also serves to reflect light such that light within the first core tends to stay within the first core.

The alignment of the first and second cores should be very accurate. Transmitted light signals have ripples that degrade performance when the first and second cores are not properly aligned. However, alignment marks used to align the first and second cores, or to align other components of the PLC, are typically positioned under several layers with similar refractive indexes, such as the layers used to produce the first and second cores. A large distance between the surface of the uppermost layer of the plurality of layers and an alignment mark decreases the image of the alignment mark and thereby decreases the accuracy of the alignment. For example, the image of the alignment mark may be blurred or obscured. Furthermore, a plurality of layers with refractive indexes that are slightly different tend to shift the perceived location of the alignment mark and make accurate imaging of the alignment mark even more difficult.

Accordingly, it is desirable to provide integrated circuits with accurately aligned components for use in PLC devices, and methods for producing the same. In addition, it is desirable to provide integrated circuits with alignment marks that can be viewed more clearly than traditional alignment marks, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing the same are provided. In an exemplary embodiment, a method of producing an integrated circuit includes forming a base layer overlying a substrate, and forming an alignment mark overlying the base layer. A first layer is formed overlying the base layer and the alignment mark, and the first layer has a first layer thickness. A second layer is formed overlying the first layer, where the second layer has a second layer thickness and where a combined thickness of the first and second layer thicknesses is from about 2 to about 50 micrometers. A second component is formed from the second layer.

A method of producing an integrated circuit is provided in another embodiment. A base layer is formed overlying a substrate, and a first component is formed overlying the base layer. A second component is formed overlying the base layer, where forming the second component includes aligning the second component with the first component by viewing an alignment mark through a first and second layer. The first and second layers have a first and second refractive index, respectively, that are within about 0.05 units of each other.

An integrated circuit is provided in yet another embodiment. The integrated circuit includes a base layer overlying a substrate, and a first component overlying the base layer. The first component has a first refractive index and a first bottom surface. An alignment mark overlies the base layer, where the alignment mark has an alignment mark bottom surface that is co-planar with the first bottom surface. A second component overlies the base layer and directly contacts the first component. The second component has a second refractive index that is within about 0.05 units of the first refractive index.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits, including planar lightwave circuits, and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
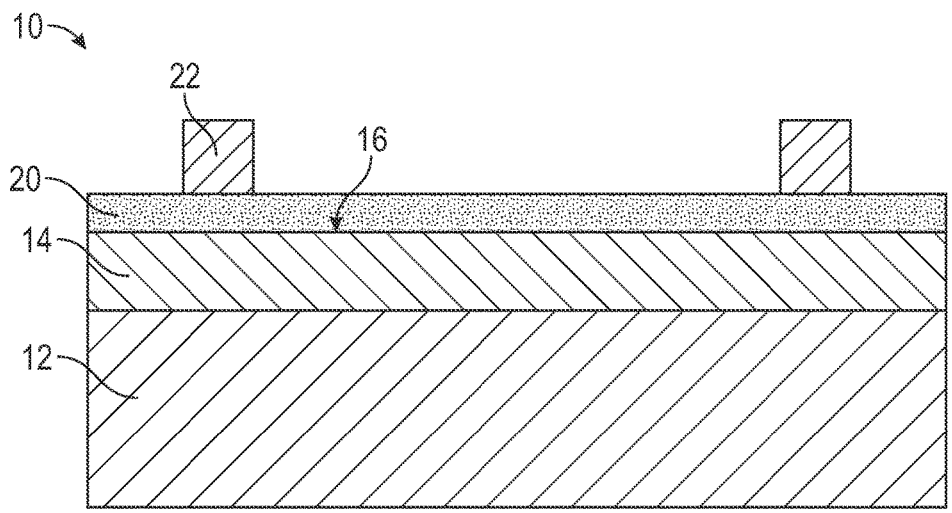
FIGS. 1-8 are cross-sectional views illustrating portions of an integrated circuit and methods for its fabrication in accordance with an exemplary embodiment.

Referring to the exemplary embodiment in FIG. 1, an integrated circuit 10 includes a substrate 12. As used herein, the term "substrate" will be used to encompass semiconductor materials conventionally used in the semiconductor industry from which to make electrical or optical devices, but the substrate may also be electrically insulating or electrically conductive materials that provide base for production of the integrated circuit, such as ceramics, polymeric materials, or other materials. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate may be a bulk silicon wafer (as illustrated) or may be a thin layer of silicon on an insulating layer (commonly known as silicon-on-insulator or SOI) that, in turn, is supported by a carrier wafer.

In an embodiment and referring again to FIG. 1, a base layer 14 is formed overlying the substrate 12. As used herein, the term "overlying" means "over" such that an intervening layer may lie between the base layer 14 and the substrate 12, and "on" such that the base layer 14 physically contacts the substrate 12. The base layer 14, as referred to herein, is the layer underlying and directly contacting a first component (described below). The base layer 14 may be from about 1 to about 10 micrometers (microns, or μm) thick, or about 1 to about 5 μm thick, or about 2 to about 4 μm thick in various embodiments, but other thicknesses are also possible. In an exemplary embodiment, the base layer 14 includes silicon dioxide, which may be deposited by plasma enhanced chemical vapor deposition using silane and oxygen, but other materials may be used in alternate embodiments. The material of the base layer 14 has a base refractive index, and the refractive index of silicon dioxide can vary depending on the method of formation, the density (which can be modified by densification steps), impurities present, etc. In an exemplary embodiment, the base refractive index is about 1.460, such as from about 1.455 to about 1.465, or about 1.458 to about 1.462, or about 1.459 to about 1.461 in various embodiments. In this description, all measurements of the refractive index refer to measurements at a wavelength of 589 nanometers and a temperature of 20 degrees centigrade (° C.).

The base layer 14 may overlie one or more other layers (not illustrated) in some embodiments, including but not limited to one or more layers of silicon dioxide formed by chemical vapor deposition of tetraethylorthosilicate (TEOS), silicon dioxide formed by thermally oxidizing a silicon substrate 12, or other layers. The additional layers (not illustrated) may help adhere the base layer 14 to the substrate 12, may help modify the effects of mismatches in the coefficient of thermal expansion between the substrate 12 and the base layer 14, may reduce or eliminate warping, or may serve other purposes.

In some embodiments, a base layer upper surface 16 may be smoothed by a technique such as chemical mechanical planarization before additional layers are formed. The smooth base layer upper surface 16 may aid in optical performance, such as reflection, when the base layer is utilized as a first, second, or third core for a planar waveguide. Other layers described below may also have their upper surfaces smoothed, such as by chemical mechanical planarization, before being covered or otherwise incorporated into an integrated circuit 10 to improve optical performance, even if such smoothing is not specifically mentioned for each layer or component as formed.

In an embodiment and referring again to FIG. 1, an alignment mark layer 20 is formed overlying the base layer 14 in an exemplary embodiment. The alignment mark layer 20 may include silicon nitride, which can be formed by chemical vapor deposition using ammonia and dichlorosilane. The alignment mark layer 20 may have an alignment mark transparency that is less than a base layer transparency of the base layer 14. Transparency, as used herein, refers to the ratio of transmitted light to the incident light at an incidence angle of 90 degrees to the surface of the material. Transparency is measured through a constant thickness, such as about 0.2 millimeters, but other thicknesses can be used as long as comparison of transparency between different materials uses samples of the same thickness. Transparency measurement is discussed in ASTM standard D 1746, and transparency measurements as discussed herein are consistent with that standard.

In an embodiment and referring again to FIG. 1, an alignment mark photoresist layer 22 is formed and patterned overlying the alignment mark layer 20. One or more hard mask layers (not illustrated), antireflective layers (not illustrated), or other layers may be formed between the alignment mark photoresist layer 22 and the alignment mark layer 20 in various embodiments. In an exemplary embodiment, the alignment mark photoresist layer 22 (and other photoresist layers described below) are deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations are removed with an organic solvent, and portions of the alignment mark photoresist layer 22 remain overlying selected areas of the alignment mark layer 20. Selective etchants can be used for any hard mask layers or antireflective layers that may be present (not illustrated), such that desired areas of the alignment mark layer 20 are exposed.

Figure 2:
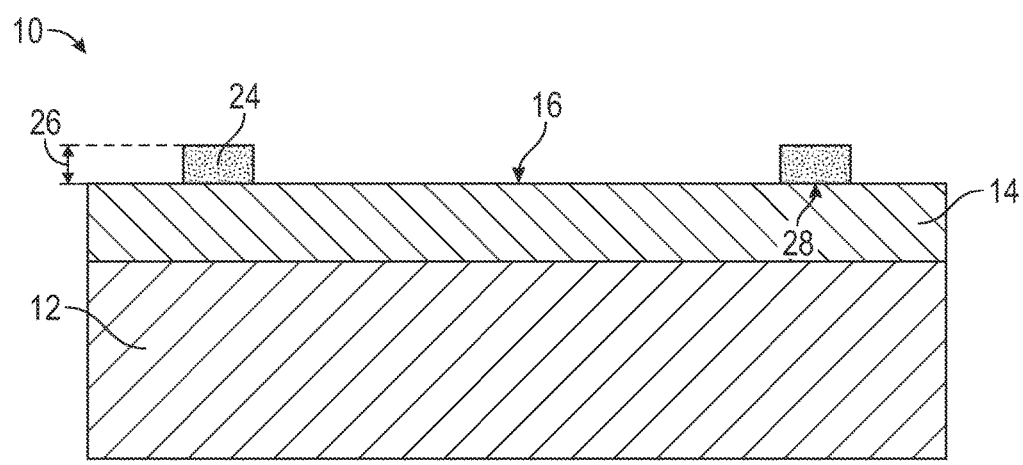

Referring to an exemplary embodiment in FIG. 2, with continuing reference to FIG. 1, the alignment mark layer 20 is removed except were covered by the alignment mark photoresist layer 22 (or the associated mask layer, not illustrated), and the remaining portions of the alignment mark photoresist layer 22 are also removed to leave an alignment mark 24. In an exemplary embodiment, the alignment mark layer 20 is removed with a reactive ion etch using silicon hexafluoride, but other etchants or etch techniques may be used in alternate embodiments. The remainder of the alignment mark photoresist layer 22 is removed with an oxygen containing plasma at the appropriate time. The alignment mark 24 may be smoothed, such as with chemical mechanical planarization, and brought to an alignment mark thickness indicated by reference number 26. The alignment mark 24 should be large enough to be visible, where "visible" means the alignment mark 24 can be detected and identified when viewed at about 5× magnification under a microscope or other magnification device, where 5× magnification indicates objects are increased in size 5 times over the size viewed by the naked eye. There is no need for great thickness to produce a visible alignment mark 24. In various embodiments, the alignment mark thicknesses 26 is from about 0.1 to about 2 μm, or from about 0.2 to about 1.5 μm, or from about 0.3 to about 1.2 μm, but other size are also possible. The alignment mark 24 has an alignment mark bottom surface 28 that is planar and physically contacts the base layer 14 in an exemplary embodiment. The alignment mark 24 can have a variety of shapes, including but not limited to a bar, a plurality of parallel bars, a plus "+" sign, a solid box, a hollow box, or a circle.

Figure 3:
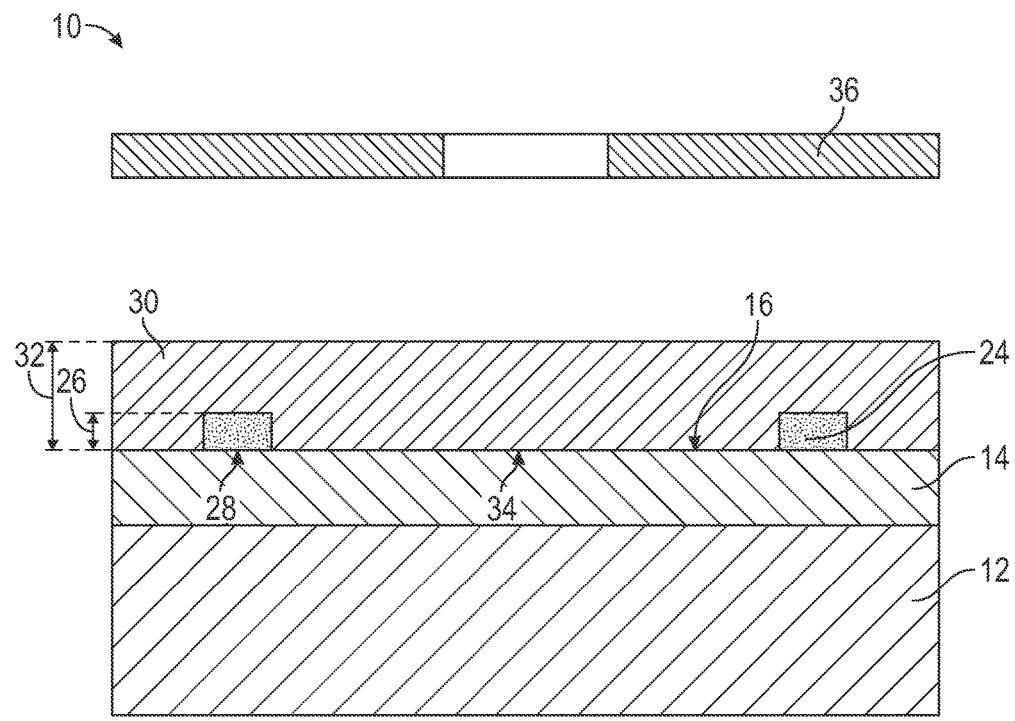

Reference is made to the embodiment illustrated in FIG. 3. A first layer 30 may be formed overlying the base layer 14 and the alignment mark 24, where the first layer 30 directly contacts the alignment mark 24. The first layer 30 has a first layer thickness, indicated by the reference number 32, of from about 0.1 to about 3 μm, or from about 0.5 to about 0.3 μm, or from about 0.8 to about 0.2 μm in various embodiments. The first layer thickness 32 is greater than the alignment mark thickness 26 in some embodiments. In an exemplary embodiment, the first layer 30 includes silicon oxynitride, which can be formed by plasma enhanced chemical vapor deposition using nitrous oxide and silane. The first layer 30 may have a first refractive index of about 1.500, such as from about 1.450 to about 1.550, or from about 1.470 to about 1.530, or from about 1.490 to about 1.510 in various embodiments. In some embodiments, the first refractive index is higher than the base refractive index. The first layer 30 has a first bottom surface 34, and the first bottom surface 34 abuts and physically contacts the base layer 14 in some embodiments. As such, the first bottom surface 34 may be planar, and may be co-planar with the alignment mark bottom surface 28.

In an exemplary embodiment, the first layer 30 is lithographically patterned in a manner similar to that described for the alignment mark 24 above. A first mask 36 may be used for the patterning, where a photoresist layer and other mask layers are not illustrated in FIG. 3. In an exemplary embodiment and referring to FIG. 4 with continuing reference to FIG. 3, a first component 38 is formed from the first layer 30. The alignment mark 24 may be viewed to help properly position the first mask 36 for forming the first component 38. The first layer 30 may be removed with a reactive ion etch using carbon tetrafluoride, but other etchants or etch techniques may be used in alternate embodiments. The first component 38 is formed overlying the base layer 14, and the alignment mark 24 also overlies the base layer 14, so the alignment mark 24 may be positioned to the side of the first component 38. That is, the first component 38 and the alignment mark 24 do not directly overlie one another or share the same space. As used herein, the term "directly overlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to the surface of the substrate 12.

The first component 38 has the same first bottom surface 34 as the first layer 30. In some embodiments, the thickness of the first component 38 is about the same as the first layer thickness 32, and the thickness of the first component 38 is greater than the alignment mark thickness 26. The first component 38 may serve as a core for a planar waveguide in some embodiments, where the first component 38 has a first refractive index that is greater than the base refractive index. The first component 38 has a first transparency that is greater than the alignment mark transparency.

Figure 4:
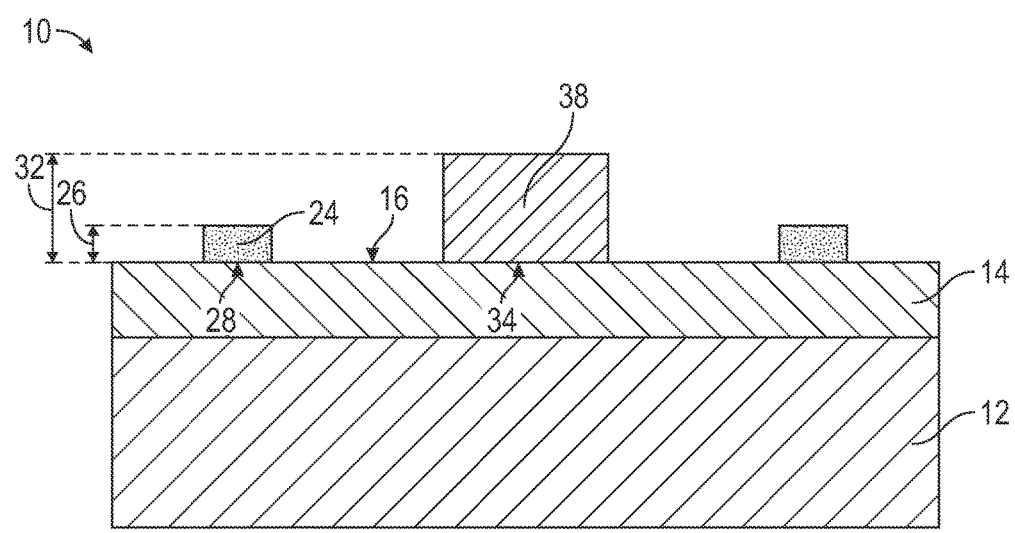
Figure 5:
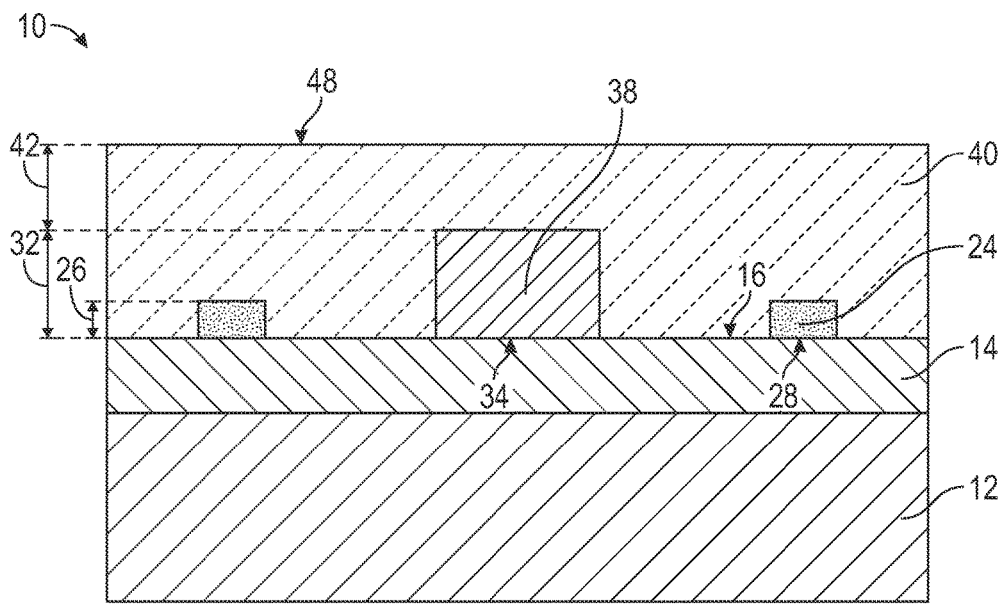

A second layer 40 is formed overlying the first layer 30 and the alignment mark 24, as illustrated in an exemplary embodiment in FIG. 5 with continuing reference to FIGS. 3 and 4. In an exemplary embodiment, the second layer 40 has a second layer thickness indicated by reference number 42, where the second layer thickness is measured from the top of the first layer 30 to the top of the second layer 40, even in embodiments where part of the first layer 30 has been removed to form the first component 38. The second layer thickness may be from about 1 to about 8 μm, or from about 1.5 to about 5 μm, or from about 2 to about 4 μm in various embodiments. The sum of the first and second layer thicknesses 32, 42 is a combined thickness of from about 2 to about 50 μm, or from about 2 to about 20 μm, or from about 2 to about 5 μm in various embodiments.

In an exemplary embodiment, the second layer 40 may include silicon dioxide formed by plasma enhanced chemical vapor deposition, as described for the base layer 14 above. As such, the second layer 40 has a second refractive index that is lower than the first refractive index, and may be from about 1.455 to about 1.465, or about 1.458 to about 1.462, or about 1.459 to about 1.461 in various embodiments as previously mentioned for the base layer 14. The second refractive index may be within about 0.10 units of the first refractive index, or within about 0.05 units of the first refractive index, or within about 0.04 units of the first refractive index in various embodiments. The refractive index is a unitless value, so reference to one refractive index being within a certain number of units of another is a reference to the numerical value of one refractive index being within a certain numerical value of another refractive index. The second layer 40 also has a second transparency that is greater than the alignment mark transparency.

Figure 6:
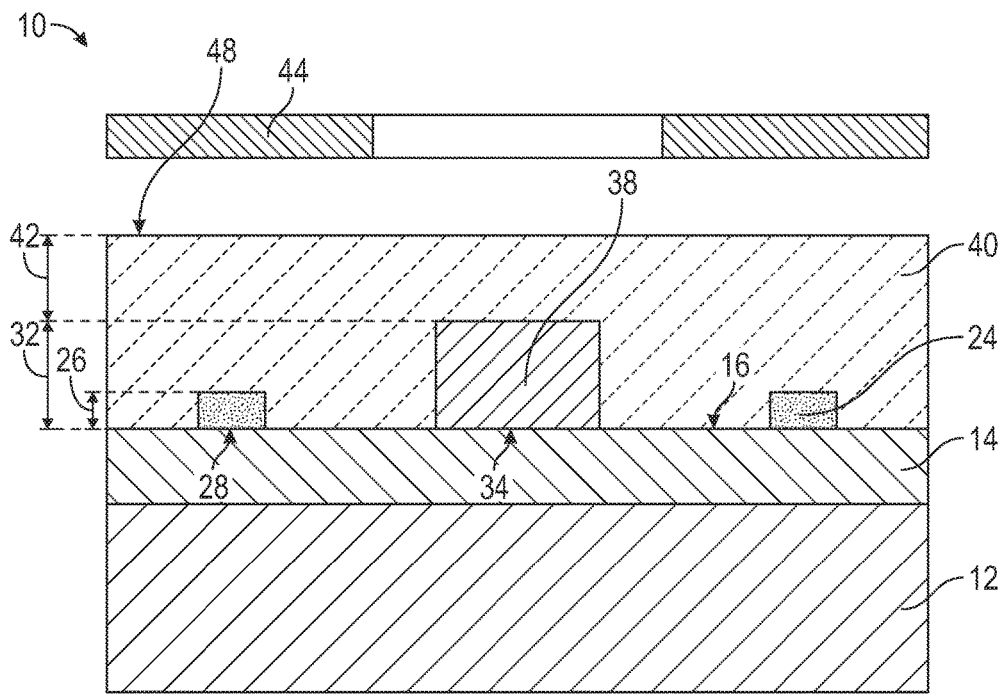
Figure 7:
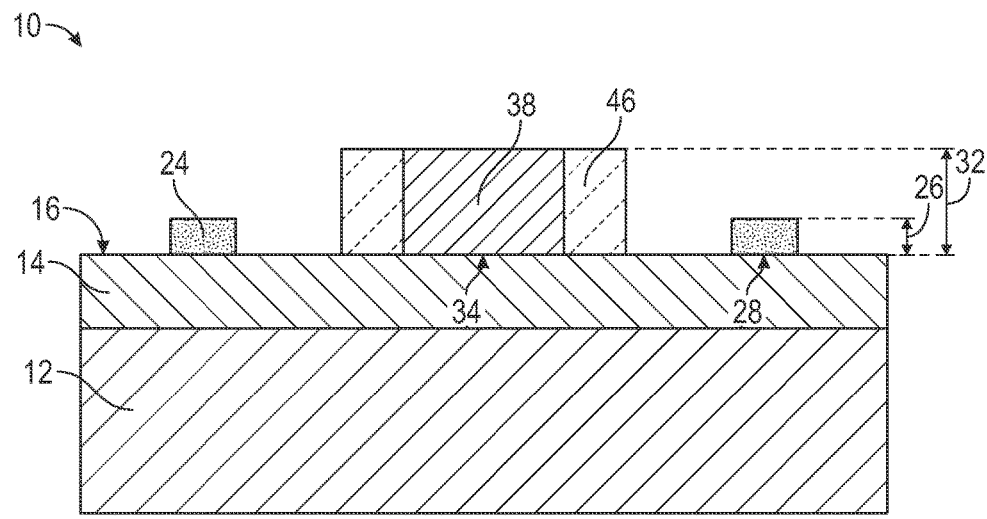

Referring to FIG. 6, a second mask 44 is used with a lithographic process to pattern the second layer 40. The photoresist and any hard mask layers that may be used in the lithographic process are not illustrated, but may be used as described above. Portions of the second layer 40 are removed to form a second component 46, as illustrated in FIG. 7 with continuing reference to FIG. 6. The second layer 40 may be removed with a reactive ion etch using carbon tetrafluoride, but other etchants or etch techniques may be used in alternate embodiments. The alignment mark 24 is viewed through the second layer 40 to align the second mask 44 for forming the second component 46. In an exemplary embodiment the alignment mark 24 is viewed by a tool, but in other embodiments the alignment mark 24 may be viewed by a human. The alignment mark 24 overlies the base layer 14, so the distance between a second layer top surface 48 and the alignment mark 24 is limited to no more than the combined thickness of the first and second layer thicknesses 32, 42. This relatively short distance improves clarity when viewing the alignment mark 24 over an alignment mark that may be positioned underlying the base layer 14. Improved clarity in viewing the alignment mark 24 can increase the accuracy of alignment of the second mask 44, and thereby increase precision during formation of the second component 46.

In the exemplary embodiment illustrated in FIG. 7, the second component 46 is adjacent to side surfaces of the first component 38, and the second component 46 directly contacts sidewalls of the first component 38. The height of the second component 46 has been reduced, such as with chemical mechanical planarization, to expose a top surface of the first component 38. The first refractive index is higher than the either the base refractive index or the second refractive index, and in some embodiments the first refractive index is within 0.1 units, or 0.05 units, or 0.04 units of either of the base refractive index or the second refractive index, as discussed above. The second component 46 and the base layer 14 may serve as a second outer core in a planar waveguide, with the first component 38 serving as a first inner core.

Figure 8:
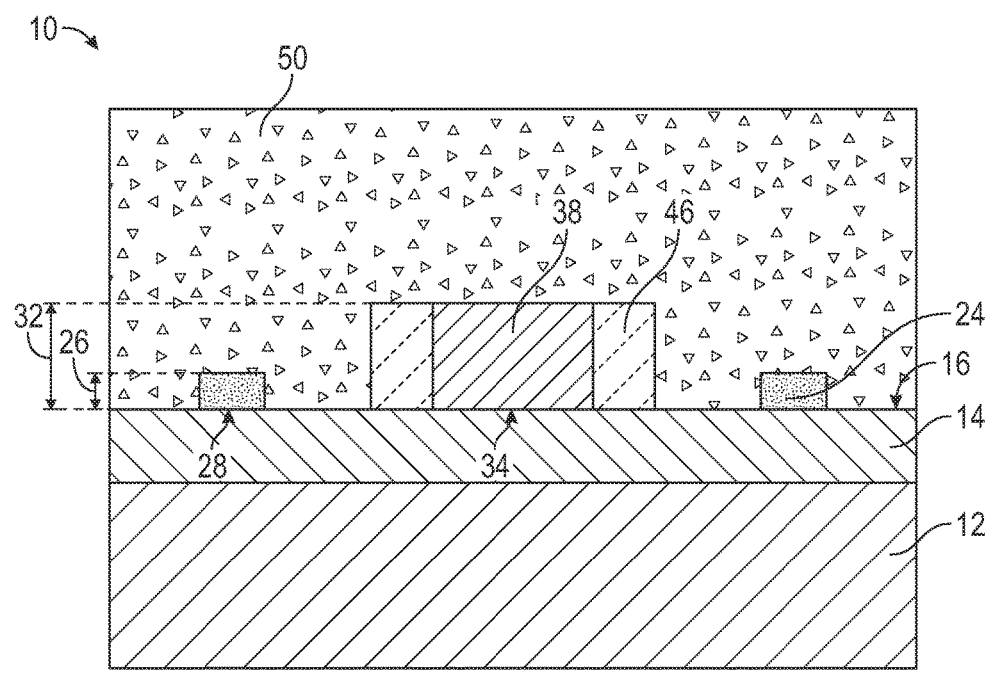

Reference is made to the exemplary embodiment in FIG. 8. A third layer 50 is formed overlying the first component 38 and the second components 46, the alignment mark 24 (if present), and the base layer 14. In some embodiments, the alignment mark 24 may be removed during formation of the second component 46. The alignment mark 24 is used to position and align the second mask 44 illustrated in FIG. 6, so the alignment mark 24 may not needed after the second mask 44 has been positioned. In an exemplary embodiment, the third layer 50 is silicon dioxide formed by chemical vapor deposition using TEOS. The refractive index of silicon dioxide formed by chemical vapor deposition using TEOS is less than that of silicon dioxide formed by plasma enhanced chemical vapor deposition using silane and oxygen in some embodiments, so the second component 46 and the base layer 14 may have a higher refractive index than the third layer 50. The third layer 50 may be used to seal and secure the first and second components 38, 46 in place, so the third layer 50 may include other materials in alternate embodiments.

Figure 9:
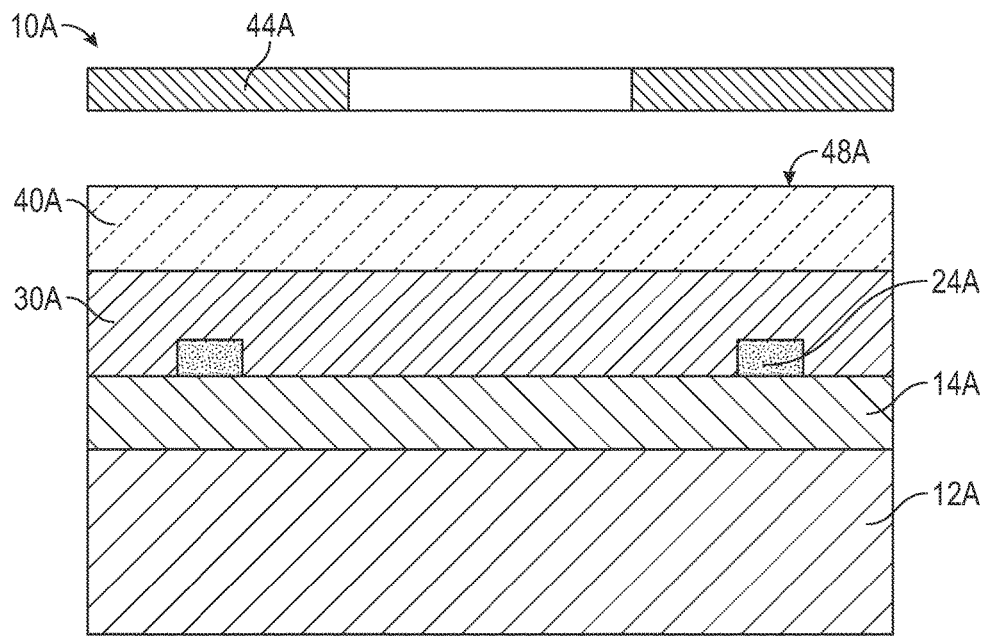
FIGS. 9-11 are cross-sectional views illustrating portions of an integrated circuit and methods for its fabrication in accordance with another embodiment.
Figure 10:
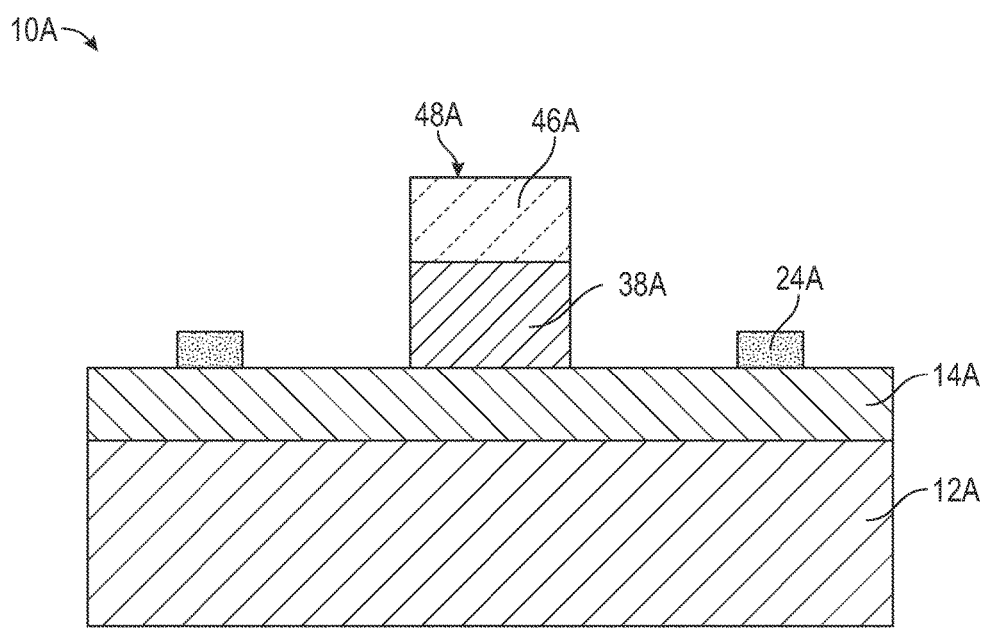
Figure 11:
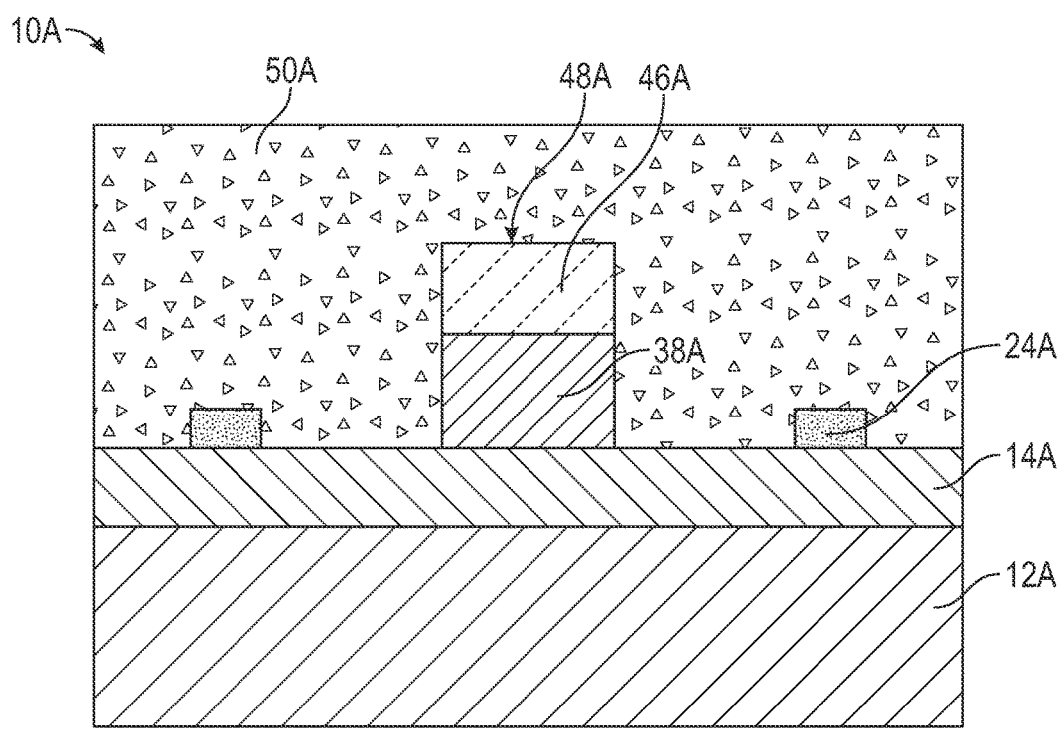

An alternate embodiment is illustrated in FIGS. 9-11, where FIG. 9 follows FIG. 2. In FIG. 9, the first layer 30A is formed overlying the base layer 14A and the second layer 40A is formed overlying the first layer 30A, all of which overlie the substrate 12A. The first and second layers 30A, 40A are as described above, except the second layer 40A is formed before the first layer 30A is patterned. A second mask 44A is used with a lithographic process, as described above, to pattern the first and second layers 30A, 40A in the same step, in sequential steps, or in separate steps. Referring to FIG. 10 with continuing reference to FIG. 9, the first and second components 38A, 46A are formed from the first and second layers 30A, 40A, as described above, except the second component 46A overlies the first component 38A instead of being adjacent to the first component 38A. In an exemplary embodiment, the second component 46A directly contacts a top surface of the first component 38A. As such, the alignment mark 24A is viewed through both the first and second layers 30A, 40A for positioning and alignment of the second mask 44A. The slightly different first and second refractive indexes complicates the viewing process for the alignment mark 24A, because the view is somewhat distorted by the change in refractive index. As such, the proximity of the alignment mark 24A to the second layer top surface 48A increases clarity and accuracy when viewing the alignment mark 24A as compared to viewing an alignment mark through additional sublayers as may be the case if the alignment marks were to be formed beneath the base layer 14. The first component 38A may serve as a first core and the second component 46A and the base layer 14A may serve as a second core for a planar waveguide in the embodiment illustrated in FIG. 10, as described above.

Referring to FIG. 11, a third layer 50A is formed overlying the first and second components 38A, 46A, the alignment mark 24A (if present), and the base layer 14A, as described above. The first and second components 38A, 46A and the other components described above may be incorporated into an integrated circuit 10A using conventional methods.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   forming a base layer overlying a substrate;
   forming an alignment mark overlying the base layer;
   forming a first layer overlying the base layer and the alignment mark, wherein the first layer comprises a first layer thickness;
   forming a second layer overlying the first layer, wherein the second layer comprises a second layer thickness, and wherein a combined thickness of the first layer thickness and the second layer thickness is from about 2 micrometers to about 50 micrometers; and
   forming a second component from the second layer, wherein forming the second component comprises viewing the alignment mark through the first layer and the second layer, wherein the first layer comprises a first refractive index measured at 589 nanometers, wherein the second layer comprises a second refractive index measured at 589 nanometers, and wherein the second refractive index is within about 0.05 units of the first refractive index.

2. The method of claim 1 wherein forming the second component comprises forming the second component wherein the second refractive index is within about 0.02 units of the first refractive index.

3. The method of claim 1 wherein:
   forming the first layer comprises forming the first layer comprising a first bottom surface; and
   forming the alignment mark comprises forming the alignment mark comprising an alignment mark bottom surface that is coplanar with the first bottom surface.

4. The method of claim 1 further comprising:
   forming a first component from the first layer, wherein the first component and the second component form at least a portion of a planar waveguide.

5. The method of claim 4 wherein forming the first component comprises forming the first component with a first refractive index greater than a second refractive index of the second component.

6. The method of claim 1 further comprising:
   patterning the first layer to form a first component prior to forming the second layer.

7. The method of claim 6 wherein patterning the first layer to form the first component comprises:
   aligning a first mask overlying the first layer using the alignment mark.

8. The method of claim 1 further comprising:
   forming a first component from the first layer wherein the second component overlies the first component.

9. The method of claim 1 further comprising:
   viewing the alignment mark to position the second component; and aligning a second mask over the second layer with the alignment mark.

10. The method of claim 1 further comprising:
forming a third layer overlying the second component.

11. The method of claim 1 wherein:
forming the alignment mark comprises forming the alignment mark wherein the alignment mark has an alignment mark transparency less than a first layer transparency.

12. The method of claim 11 wherein:
forming the alignment mark comprises forming the alignment mark wherein the alignment mark transparency is less than a second layer transparency.

13. The method of claim 1 wherein:
forming the alignment mark comprises forming the alignment mark with an alignment mark height less than a first layer height.

14. A method of producing an integrated circuit comprising:
forming a base layer overlying a substrate;
forming a first component overlying the base layer; and
forming a second component overlying the base layer, wherein forming the second component comprises aligning the second component with the first component by viewing an alignment mark through a first layer and a second layer, wherein the first layer and the second layer have a first refractive index and a second refractive index, respectively, that are within about 0.05 units of each other.

15. The method of claim 14 wherein forming the second component comprises viewing the alignment mark through the first layer and the second layer wherein the first layer and the second layer have a combined thickness of from about 2 to about 50 micrometers.

16. The method of claim 14 wherein forming the second component comprises:
aligning the second component with the first component by viewing the alignment mark, wherein the alignment mark comprises an alignment mark bottom surface that is coplanar with a first component bottom surface.

17. The method of claim 14 further comprising:
forming a third layer overlying the first component and the second component.

18. The method of claim 14 wherein forming the first component and forming the second component comprises forming a planar waveguide.

19. An integrated circuit comprising:
a substrate;
a base layer overlying the substrate;
a first component overlying the base layer, wherein the first component comprises a first refractive index measured at 589 nanometers, and the first component comprises a first bottom surface;
an alignment mark overlying the base layer, wherein the alignment mark comprises an alignment mark bottom surface that is co-planar with the first bottom surface; and
a second component overlying the base layer, wherein the second component directly contacts the first component, wherein the second component comprises a second refractive index measured at 589 nanometers, and wherein the second refractive index is within about 0.05 units of the first refractive index.

* * * * *